United States Patent [19]

Hemmah

[11] Patent Number: 5,179,030

[45] Date of Patent: Jan. 12, 1993

[54] METHOD OF FABRICATING A BURIED ZENER DIODE SIMULTANEOUSLY WITH OTHER SEMICONDUCTOR DEVICES

[75] Inventor: Steven M. Hemmah, Salem, N.H.

[73] Assignee: Unitrode Corporation, Billerica, Mass.

[21] Appl. No.: 692,013

[22] Filed: Apr. 26, 1991

[51] Int. Cl.⁵ .................. H01L 21/265; H01R 21/22
[52] U.S. Cl. .................................... 437/26; 437/28; 437/33; 437/154; 437/904
[58] Field of Search .............. 437/28, 29, 30, 151, 437/150, 154, 904; 148/DIG. 174; 352/13, 191, 26, 33

[56] References Cited

U.S. PATENT DOCUMENTS

| | | | |
|---|---|---|---|
| 3,655,457 | 4/1972 | Duffy et al. | 437/904 |
| 3,881,179 | 4/1975 | Howard | 357/13 |
| 4,021,270 | 5/1977 | Hunt et al. | 437/5 |
| 4,136,349 | 1/1979 | Tsang | 357/13 |
| 4,403,395 | 9/1983 | Curran | 437/74 |
| 4,601,760 | 7/1986 | Hemmah et al. | 357/91 |
| 4,742,021 | 5/1988 | Burnham et al. | 437/149 |
| 4,766,469 | 8/1988 | Hill | 357/13 |
| 4,771,011 | 9/1988 | Hemmah et al. | 357/13 |
| 4,833,509 | 5/1989 | Hickox et al. | 357/13 |
| 5,013,687 | 5/1991 | Solomon | 437/51 |

FOREIGN PATENT DOCUMENTS

| | | | |
|---|---|---|---|
| 8203862 | 11/1982 | Netherlands | 357/13 |
| 2130792 | 11/1982 | United Kingdom | 357/13 |

Primary Examiner—Olik Chaudhuri
Assistant Examiner—Loc Q. Trinh
Attorney, Agent, or Firm—Weingarten, Schurgin, Gagnebin & Hayes

[57] ABSTRACT

A method for fabricating a buried zener diode concurrently with other semiconductor devices on a large scale semiconductor wafer includes utilizing a composite mask to define one or more stable buried zener diodes, one or more additional semiconductor devices, and a number of isolation regions. After applying a screen oxide over selected portions of the semiconductor wafer, subsequent ion implantation steps and additional masking steps concurrently form the stable buried zener diode along with additional and different semiconductor devices utilizing conventional ion implant bi-polar processing techniques.

7 Claims, 8 Drawing Sheets

METHOD OF FABRICATING A BURIED ZENER DIODE SIMULTANEOUSLY WITH OTHER SEMICONDUCTOR DEVICES

FIELD OF THE INVENTION

This invention relates to integrated circuits and more particularly, to a process for forming an all implanted buried zener diode on a wafer scale semiconductor substrate while concurrently producing other semiconductor devices

BACKGROUND OF THE INVENTION

Integrated circuits often use zener diodes to form reference voltages or high power clamp diodes. The diodes must be stable with little or no drift to ensure the stable operation of the integrated circuit which uses the diode. Zener diodes with breakdown regions at or near the surface of the integrated circuit are generally very unstable and exhibit many other undesirable characteristics.

Several attempts have been made at providing zener diodes with buried or subsurface breakdown regions to avoid unstable diode operation. These attempts, however, have been met with little or limited success due to a wide variety of reasons.

For example, U.S. Pat. No. 4,079,402 produces a breakdown region which is so shallow, that unstable diode performance is exhibited.

U.S. Pat. No. 4,213,806 exhibits an additional problem in that when conventional bi-polar processing techniques disclosed in this patent are applied to wafer scale substrates, there is a tendency for the buried zener diode to break down at the surface of the silicon wafer and thus become non-buried, with a corresponding potential for unstable performance.

Although U.S. Pat. Nos. 4,771,011 and 4,601,760 disclose forming a buried zener diode in a wafer scale integrated circuit, the processes involved are much different and include many additional steps added to the conventional bipolar process, which unduly complicate and add to the processing time required to produce a finished zener diode. Further, forming additional devices on the large scale wafer involve the use of additional masks and thus, mask registration and alignment problems present additional difficulties.

SUMMARY OF THE INVENTION

This invention features a novel method for processing a large, wafer scale semiconductor substrate to form a stable buried zener diode concurrently with other and different semiconductor devices on the wafer. Further, the stable buried zener diode processed according to the method of the present invention is provided with a break down region which is stable and remains well below the surface of the semiconductor wafer.

All diffusions of the stable buried zener diode concurrently produce other structures such as NPN transistors utilizing ion implanted bi-polar processing on large scale silicon wafers. Further, slow ramping diffusion steps and temperatures are utilized to avoid crystal damage and other stress related processing defects.

DESCRIPTION OF THE DRAWINGS

These, and other features and advantages of the present invention will be better understood by reading the following detailed description, taken together with the drawings in which.

DETAILED DESCRIPTION OF THE INVENTION

Figure 1:
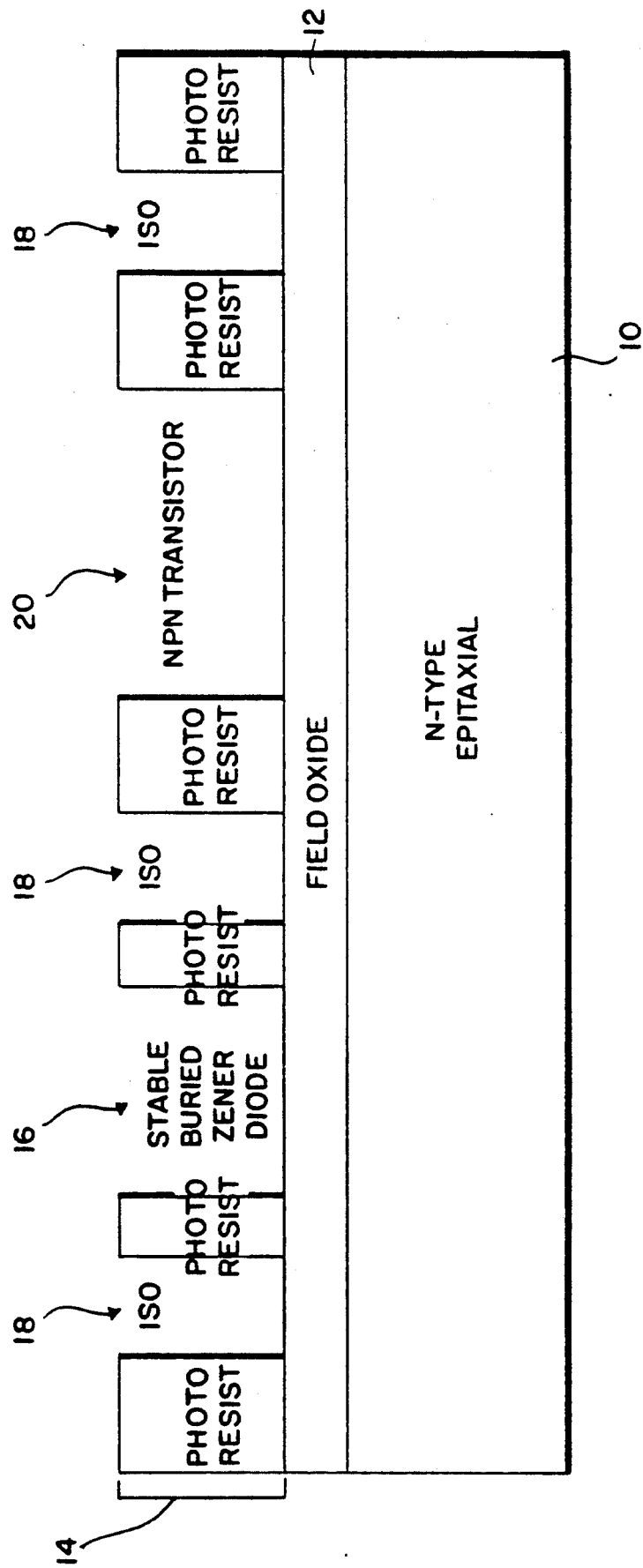
FIGS. 1–8 are cross sections of a portion of a large scale silicon wafer illustrating the process for forming a stable buried zener diode concurrently with other semiconductor devices.

The method for forming a buried zener diode concurrently with additional semiconductor devices according to the present invention is practiced on a large scale semiconductor wafer such as a silicon wafer of typically four inches or greater in diameter, and on which has been grown an N type epitaxial layer 10, FIG. 1. A thick field oxide layer 12 of approximately 11,000 A in thickness is then applied over the epitaxial layer 10.

A first mask 14 is then applied over the field oxide layer 12. The first mask, which is a photo-resistive layer, is a composite mask that defines the P region, 16, of a least one stable buried zener diode; a plurality of isolation regions 18; and at least a portion of at least one additional and different semiconductor device 20, which in this embodiment is illustrated as the base area of an NPN transistor.

The composite first mask layer 14 thus serves to define the P region of a stable buried zener diode, a least a portion of an additional and different semiconductor device, as well as isolation regions which serve to provide an electrical barrier between adjacent semiconductor devices on the large scale wafer. Accordingly, such a mask allows for very closely spaced semiconductor devices due to the self aligning nature of the single mask compared to the traditional process of utilizing three masks to separately define the isolation, diode, and other semiconductor regions.

Figure 2:
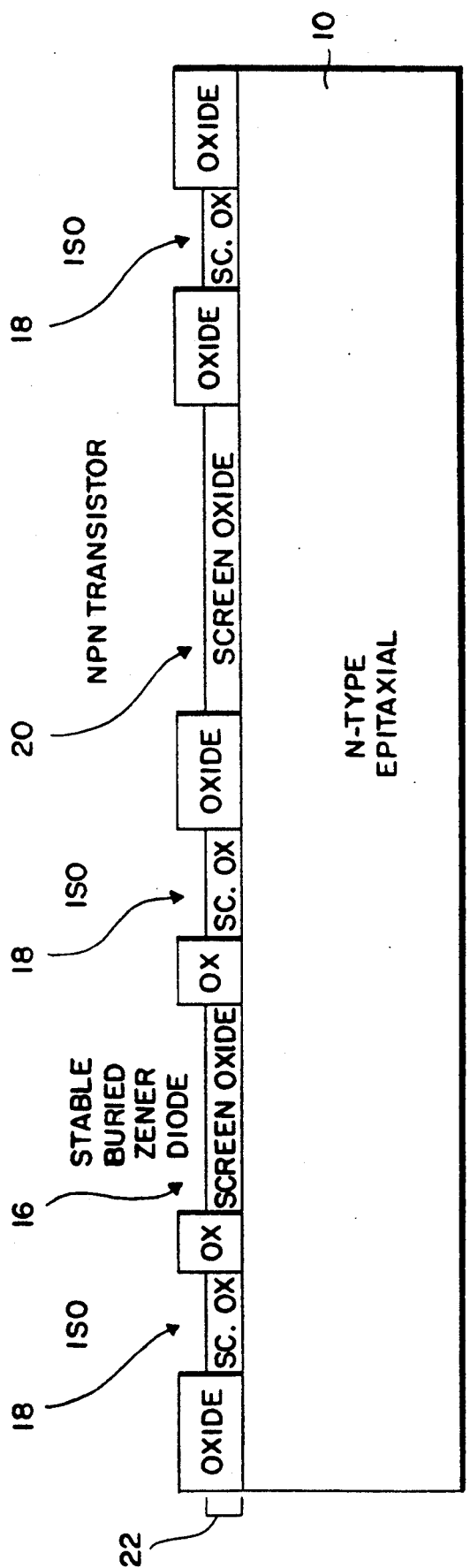

After the first mask 14 is defined and applied to the field oxide layer 12, the field oxide is etched to the silicon surface of the epitaxial layer, and a screen oxide layer 22, FIG. 2, is grown over the epitaxial layer 10 in those areas 16-20 where the field oxide layer was etched as defined by the first mask layer 14. Screen oxide layer 22 is substantially thinner than field oxide layer 12. In this embodiment, screen oxide layer 22 is approximately 4,000 A in thickness. The thinner screen oxide layer 22 thus does not prevent a barrier to subsequent ion implantation which may be performed through the screen oxide into the underlying silicon of the epitaxial layer while any remaining field oxide layer 12 serves as a barrier to ion implantation. Additionally, the screen oxide layer provides some resistance to subsequent etching steps.

Figure 3:
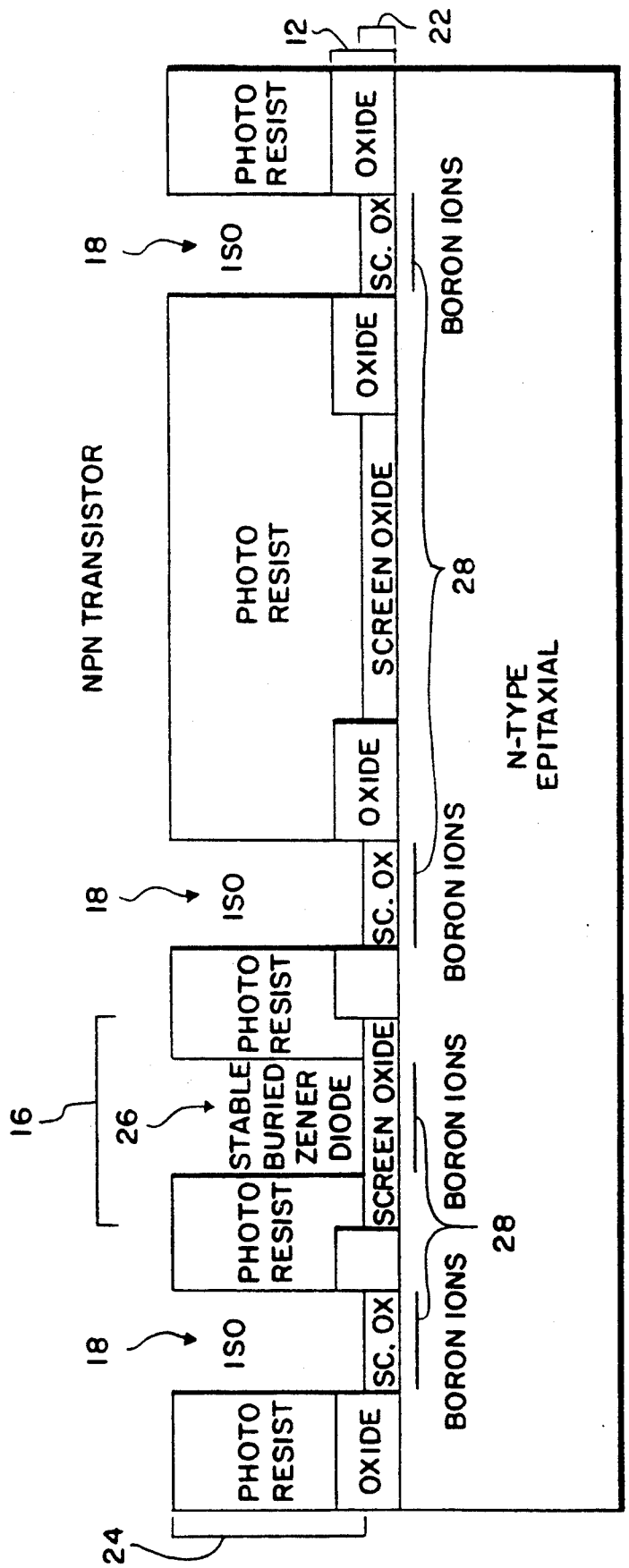

After screen oxide layer 22 is grown in the previously etched regions of the silicon wafer, a second mask layer 24, FIG. 3 is selectively applied over selected regions of both field oxide layer 12 and screen oxide layer 22. Second mask layer 24 defines and selects from among the previously defined regions on the large scale wafer the plurality of isolation regions 18 and the P-side breakdown region 26 of each of the stable buried zener diodes to be fabricated on the wafer, with all other regions of the surface of the wafer covered with the photo-resistive second mask layer 24. The area of P-side breakdown region area 26 of the stable buried zener diode is less than the area 16 of the stable buried zener diode defined by the first mask. The P side breakdown region 26 of the stable buried zener diode is approximately centered within area 16.

After applying the second mask layer 24, the method of the present invention includes performing a first P type ion implant 28, through screen oxide layer 22 in regions 18 and 26 defined by said second mask layer. P type ions such as Boron ions are implanted at a concentration of approximately $1 \times 10^{15}$ ions/cm$^2$. Subsequently, photo-resistive second mask layer 24 is removed.

Figure 4:
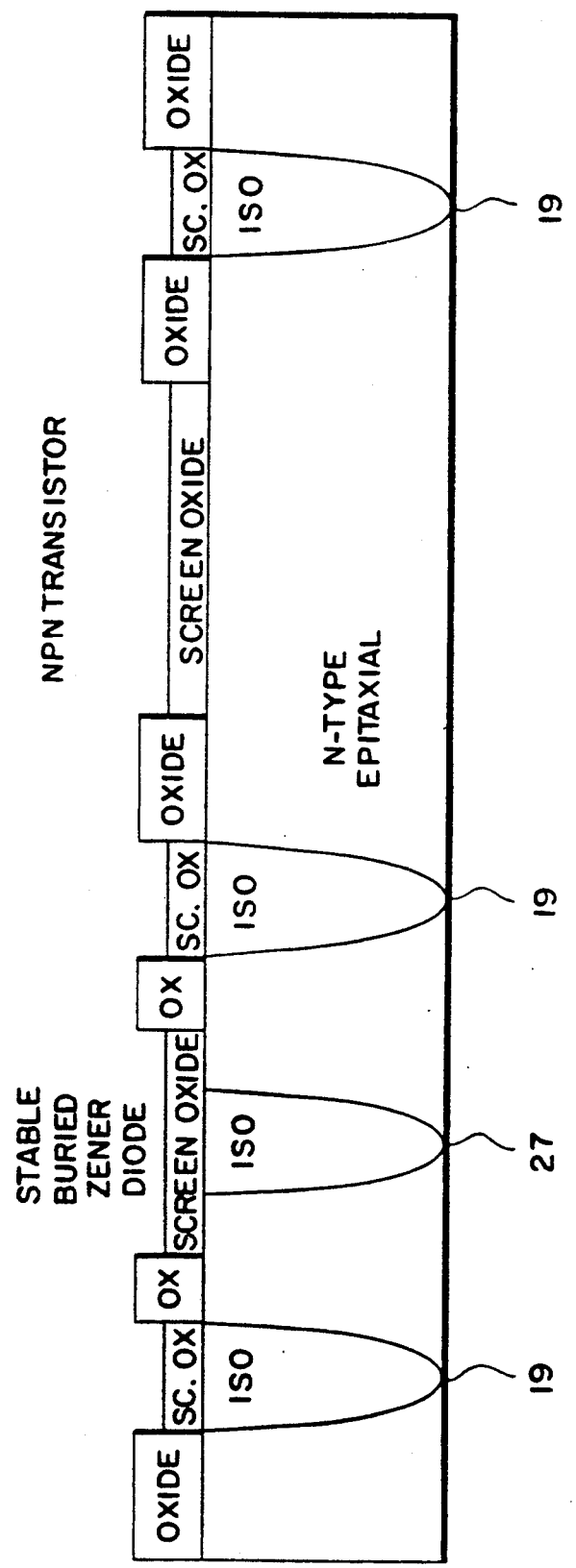

A slow ramp diffusion is then performed as in typical thermal furnace processing of bi-polar integrated circuits. The slow ramp diffusion process avoids crystalline and other damage to the large scale semiconductor wafer. This slow ramp diffusion process "drives" in the P type Boron ions forming the buried zener diode P side breakdown region 27, FIG. 4, and the P isolation regions 27. Typically, the slow ramp diffusion process is carried out at approximately 1,200° C. for a period of time which is dependent upon the thickness of the epitaxial layer For example, 1 ½ hour diffusion process has been found satisfactory for an epitaxial thickness of 10 microns. The slow ramp diffusion process ramps the temperature of the large scale semiconductor wafer at a rate of approximately 3° to 10° C./minute.

Figure 5:
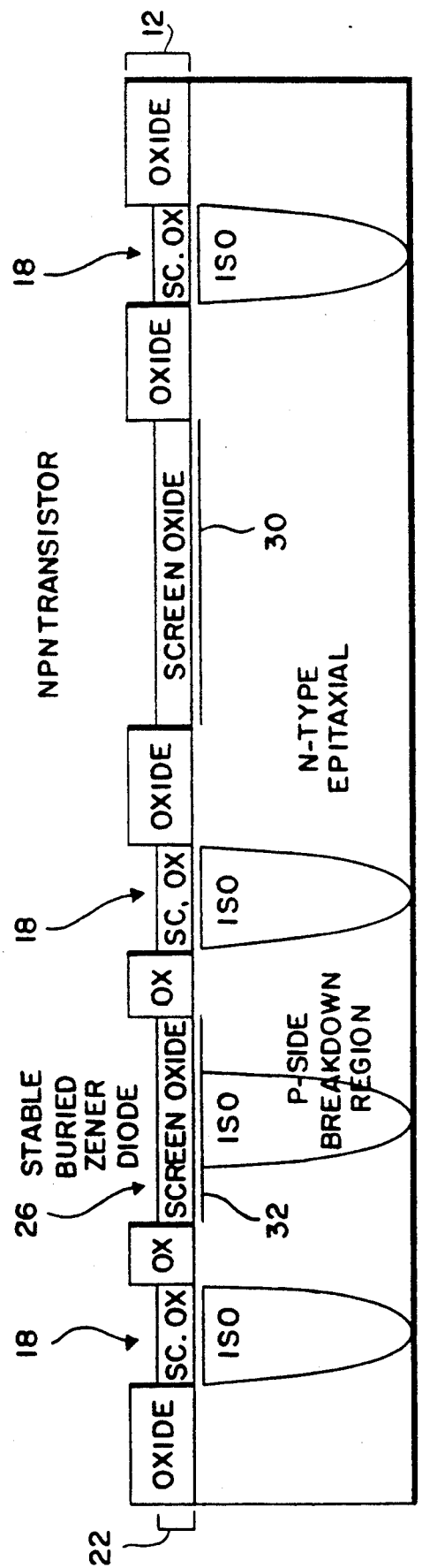

After the first P type Boron ion implant and first slow ramp diffusion, the method of the present invention continues with a second implant of P type Boron ions performed with no mask as shown in FIG. 5. Field oxide layer 12 serves to inhibit or prevent the diffusion of Boron ions into the epitaxial layer, while screen oxide layer 22 is essentially transparent to the implanted ions. Accordingly, no additional masking step is necessary at this point in the method of the present invention therefore eliminating an additional masking step and eliminating mask alignment and other related difficulties.

Thus, during the second P type ion implant, NPN transistor base region 30 which is used for exemplary purposes as well as stable buried zener diode coincident region 32 are implanted with the P type ions. The second P type Boron ion implant is performed at a concentration of approximately $1 \times 10^{14}$ ions/cm$^2$. In addition to the base region 30 of an NPN transistor, coincident region 32 of the stable buried zener diode will include an area coincident with P side breakdown region 26 previously diffused as well as an area which extends horizontally or laterally out from the P side breakdown region and to which electrical contact to the diode may later be made. To avoid affecting electrical characteristics of the stable buried zener diode, it is desirable to maintain the contact regions away from the zener diode breakdown region.

Figure 6:
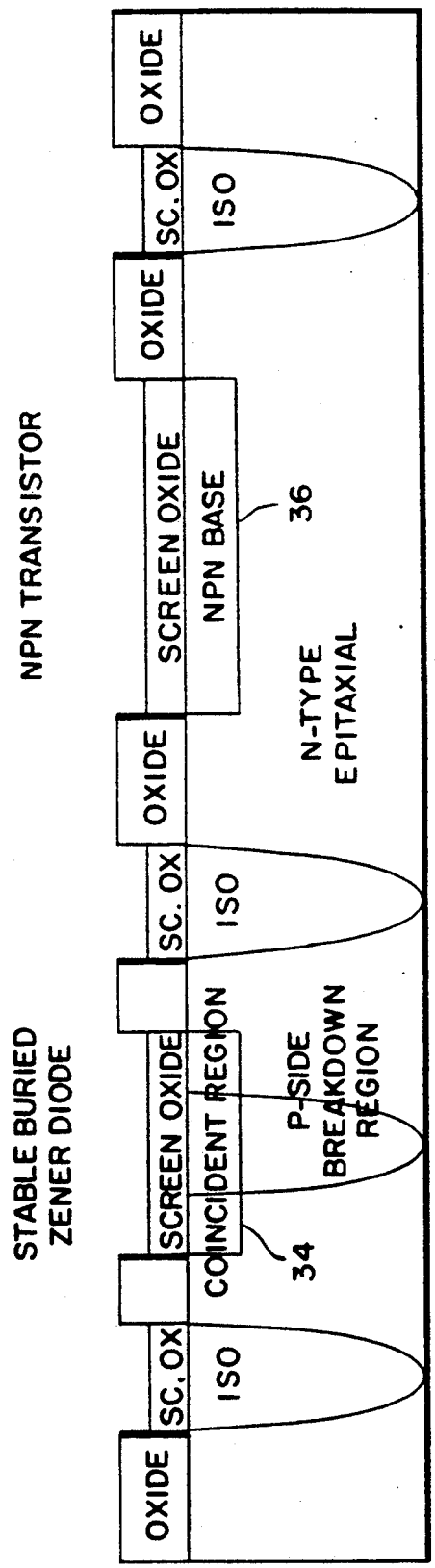
Figure 7:
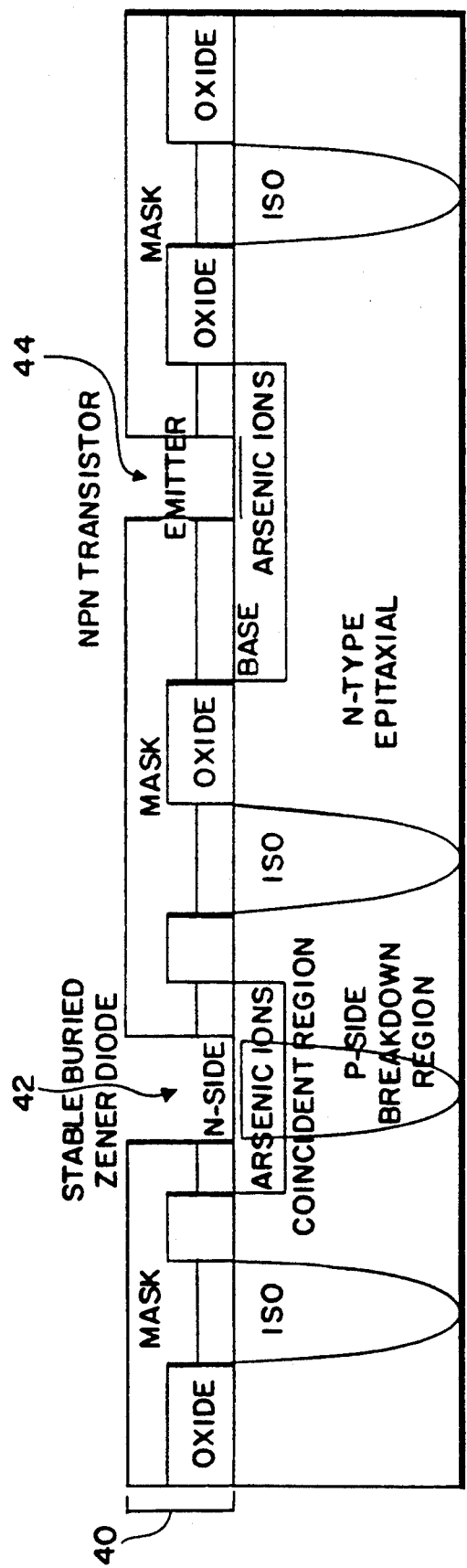

A second slow ramp diffusion reaching a temperature of approximately 900° C. over a period of 20 minutes will form the stable buried zener diode coincident region 34, FIG. 6 and the NPN transistor base region 36.

The second slow ramp diffusion "drives" the stable buried zener diode coincident region 34 and the NPN transistor base region 36 a distance into the epitaxial layer which is substantially less than the distance of the isolation regions and the P side breakdown regions. For example, coincident region 34 and the NPN base region 36 are generally driven approximately 1 micron into the epitaxial layer.

A third masking step is next performed which applies a third mask layer 40 over the field oxide and screen oxide layers of the large scale wafer. After subsequently etching the large scale wafer to the surface of the silicon in the epitaxial layer, third mask 40 defines the N side region 42 of the stable buried zener diode and the emitter region 44 of the NPN transistor. Subsequently, an N type ion implant with a substance such as Arsenic is performed which dopes the N side of the stable buried zener diode 42 and the emitter region 44 of the NPN transistor to a concentration of approximately $1 \times 10^{16}$ ions/cm$^2$.

Figure 8:
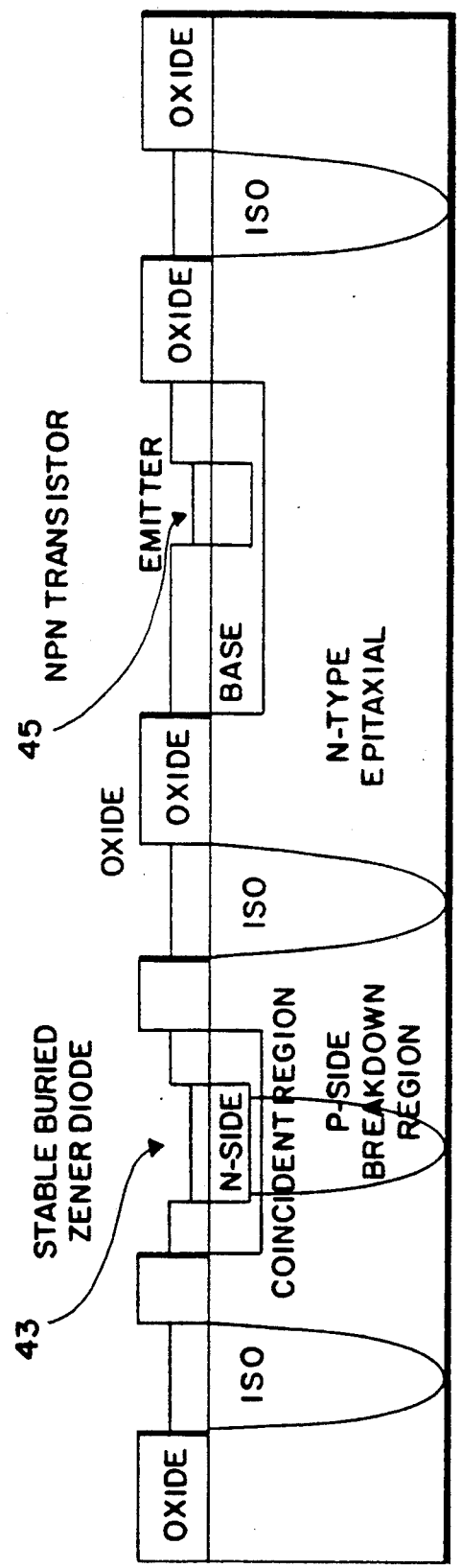

The Arsenic ion implantation is followed by a third slow ramp diffusion to a temperature of approximately 1,100° C. over approximately 30 minutes. The third slow ramp diffusion drives in the implanted Arsenic ions forming the N side of the stable buried zener diode 43, FIG. 8, and the emitter region 45 of the NPN transistor or other similar device on the semiconductor wafer.

Subsequent processing steps according to conventional bi-polar processing techniques well known to those skilled in the art include forming contact regions to all the semiconductor devices as well as metalization and passivation of the large scale semiconductor wafer.

Accordingly, the method of the present invention fabricates a buried zener diode with a stable and buried PN junction simultaneously with other semiconductor devices on a large scale semiconductor wafer with no additional steps added to an ion implanted bi-polar process. A first composite mask assures proper location of the devices and alignment of subsequent masks used to define various regions of the semiconductor devices. All diffusions required to fabricate the stable buried zener diode structure concurrently produce other devices while a slow ramping diffusion process avoids crystal damage and other stress related processing difficulties inherent in processing large scale semiconductor wafer.

Modifications and substitutions by one of ordinary skill in the art is considered to be within the scope of the present invention which is not to be limited except by the claims which follow.

I claim:

1. A method of processing a large scale semiconductor wafer on which has been grown an epitaxial layer utilizing bi-polar processing techniques, to form a stable buried zener diode with a breakdown region below the surface of the wafer, while concurrently forming at least one additional and different semiconductor device, comprising the steps of:

first performing the steps of:
growing a field oxide layer over substantially the entire epitaxial layer;
applying a first mask to a selected plurality of regions of said field oxide layer, said first mask including at least a first opening defining the location and area of at least one buried zener diode, at least a second opening defining the location and area of at least one additional and different semiconductor device, and a plurality of third openings defining the location of a corresponding plurality of isolation regions; and
etching said field oxide layer to said epitaxial layer in a plurality of regions to which said first mask was not applied, and removing said first mask;
and subsequently performing the steps of:
growing a screen oxide layer on said epitaxial layer in said plurality of regions where said field oxide layer was etched as defined by said first mask;
applying a second mask over selected regions of said field oxide layer and said screen oxide layer, said second mask including at least a first predetermined opening defining a P side breakdown region of said at least one stable buried zener diode, said P side breakdown region having an area less than the area of said at least one buried zener diode as defined by said first opening in said first mask, said second mask further including a plurality of second isolation regions corresponding with said plurality of third openings in said first mask;

performing a first P ion implant through said screen oxide layer exposed by said first and second predetermined openings in said second mask into said epitaxial layer, said P ions implanted through said screen oxide layer forming said buried zener diode P side breakdown region, and said plurality of isolation regions;

removing said second mask, exposing said plurality of first, second and third predetermined openings defined by said first mask;

driving said P ions a substantial distance into said large scale semiconductor wafer utilizing a slow ramp diffusion;

performing a second P ion implant through said screen oxide layer in the regions defined by said first, second and third predetermined openings of said first mask, said second implanted P type ions forming a P+ buried zener diode coincident region, a portion of which is coincident with said P side breakdown region, said coincident region extending laterally beyond said P side breakdown region, said P+ buried zener diode coincident region in electrical contact with said P side breakdown region, said second implanted P type ions also forming a first P+ region of said additional and different semiconductor device;

driving said second implanted P ions into said large scale semiconductor wafer using a slow ramp diffusion, said second implanted P ions being driven into said semiconductor wafers a distance substantially less than the distance of said first implant of P ions, for forming said P+ buried zener diode coincident region, coincident with said P side breakdown region of said buried zener diode, and also forming said P+ region of said at least one additional and different semiconductor device;

applying a third mask over selected areas of said large scale semiconductor wafer and including at least a first opening defining an N side region of the at least one buried zener diode and at least a second opening defining at least one N type region of said at least one additional and different semiconductor device, said N side region of the at least one buried zener diode generally coextensive with said P side breakdown region of said buried zener diode, and said at least one N type region of said at least one additional and different semiconductor device located within said P+ region of said at least one additional and different semiconductor device;

performing an N ion implant through said predetermined openings in said third mask; and driving said implanted N type ions into said large scale semiconductor wafer using a slow ramp diffusion, said N implanted ions being driven into said P side breakdown region of said buried zener diode and said P+ region of said additional and different semiconductor devices a distance substantially less than said P side breakdown and P+ regions, to form a sub-surface PN junction buried zener diode breakdown region between said N ions and said P ions of said stable buried zener diode, and for forming at least a portion of at least one additional and different semiconductor device on said large scale semiconductor wafer.

2. The method of claim 1 wherein said substrate includes a P type material and said epitaxial layer includes an N type material.

3. The method of claim 1 wherein said implanted N ions include Arsenic ions.

4. The method of claim 1 wherein said implanted P ions include Boron ions.

5. The method of claim 1 wherein said first region of said additional and different semiconductor device includes the base region of an NPN transistor.

6. The method of claim 1 wherein said steps of driving said implanted ions into said large scale semiconductor wafer using a slow ramp diffusion includes a temperature ramp rate of between 3° to 10° C. per minute.

7. The method of claim 1 further including after the step of driving said implanted N ions into said large scale semiconductor wafer, the step of forming electrical contact regions to said at least one stable buried zener diode and said at least one additional and different semiconductor device.

* * * * *

UNITED STATES PATENT AND TRADEMARK OFFICE
CERTIFICATE OF CORRECTION

PATENT NO. : 5,179,030
DATED : January 12, 1993
INVENTOR(S) : Steven M. Hemmah

It is certified that error appears in the above-indentified patent and that said Letters Patent is hereby corrected as shown below:

Column 3, line 19, "layer" should read --layer.--.

Column 5, lines 5-6, "second isolation regions" should read --second predetermined openings defining a corresponding plurality of said isolation regions--.

Signed and Sealed this

Third Day of May, 1994

Attest:

BRUCE LEHMAN

Attesting Officer *Commissioner of Patents and Trademarks*